US009403983B2

(12) United States Patent
Tsutsumi et al.

(10) Patent No.: US 9,403,983 B2
(45) Date of Patent: Aug. 2, 2016

(54) WHITE THERMOSETTING SILICONE RESIN COMPOSITION FOR A LIGHT-EMITTING SEMICONDUCTOR DEVICE AND A CASE FOR INSTALLING A LIGHT-EMITTING SEMICONDUCTOR ELEMENT

(71) Applicant: Shin-Etsu Chemical Co., Ltd., Tokyo (JP)

(72) Inventors: Yoshihiro Tsutsumi, Annaka (JP); Tadashi Tomita, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 14/717,419

(22) Filed: May 20, 2015

(65) Prior Publication Data
US 2015/0353733 A1 Dec. 10, 2015

(30) Foreign Application Priority Data
Jun. 6, 2014 (JP) ................................ 2014-117562

(51) Int. Cl.
C08L 83/06 (2006.01)
H01L 33/60 (2010.01)
(52) U.S. Cl.
CPC ................. *C08L 83/06* (2013.01); *H01L 33/60* (2013.01)
(58) Field of Classification Search
None
See application file for complete search history.

(56) References Cited

U.S. PATENT DOCUMENTS

| 3,792,012 | A | * | 2/1974 | Zdaniewski | C08G 77/06 257/791 |
| 4,000,108 | A | * | 12/1976 | Yokokawa | C08K 7/20 521/154 |
| 4,102,970 | A | * | 7/1978 | Deubzer | C08L 83/04 264/176.1 |
| 6,274,890 | B1 | * | 8/2001 | Oshio | H01L 33/486 257/100 |
| 6,806,509 | B2 | * | 10/2004 | Yoshino | C08L 83/04 257/103 |
| 2005/0244649 | A1 | * | 11/2005 | Kashiwagi | C08L 83/04 428/413 |

(Continued)

FOREIGN PATENT DOCUMENTS

| JP | 2656336 | 9/1997 |
| JP | 2000-196151 | 7/2000 |

(Continued)

*Primary Examiner* — Robert S Loewe
(74) *Attorney, Agent, or Firm* — Oblon, McClelland, Maier & Neustadt, L.L.P.

(57) ABSTRACT

The present invention provides a case for installing semiconductor element for use in LED etc. formed from a white thermosetting silicone resin composition and a cured material thereof that have low light transmittance rate, excellent moldability and are difficult to cause a burr to occur in molding. Provided is a white thermosetting silicone resin composition for a light-emitting semiconductor device, comprising: (A) a resin organopolysiloxane having a hydroxy group, and exhibiting a weight-average molecular weight of 500 to 20,000 based on polystyrene conversion, (B) an organopolysiloxane having a straight-chain diorganopolysiloxane residue, (C) a white pigment, (D) an inorganic filler other than (C), (E) a silane coupling agent in which a refractive index difference from the resin organopolysiloxane (A) is higher than or equal to 0.02 and a boiling point at atmospheric pressure is higher than or equal to 200° C., and (F) a curing catalyst.

17 Claims, 2 Drawing Sheets

(56) References Cited

U.S. PATENT DOCUMENTS

| | | | | |
|---|---|---|---|---|
| 2006/0180925 | A1* | 8/2006 | Lee | H01L 33/486 257/717 |
| 2006/0261366 | A1* | 11/2006 | Yang | H01L 33/58 257/100 |
| 2007/0007558 | A1* | 1/2007 | Mazzochette | H01L 33/641 257/239 |
| 2007/0099008 | A1* | 5/2007 | Shimizu | C08G 77/04 428/447 |
| 2007/0099009 | A1* | 5/2007 | Shimizu | C08J 7/047 428/447 |
| 2007/0284589 | A1* | 12/2007 | Ng | B29C 39/003 257/79 |
| 2008/0117619 | A1* | 5/2008 | Pang | F21K 9/00 362/84 |
| 2009/0171013 | A1* | 7/2009 | Taguchi | C08G 77/18 524/588 |
| 2009/0239997 | A1* | 9/2009 | Taguchi | C08G 77/26 524/588 |
| 2009/0304961 | A1* | 12/2009 | Taguchi | C08L 83/04 428/35.7 |
| 2009/0306263 | A1* | 12/2009 | Taguchi | C08L 83/04 524/404 |
| 2010/0213502 | A1* | 8/2010 | Kashiwagi | H01L 24/48 257/100 |
| 2010/0230693 | A1* | 9/2010 | Tran | H01L 33/483 257/98 |

FOREIGN PATENT DOCUMENTS

| | | |
|---|---|---|
| JP | 2003-224305 | 8/2003 |
| JP | 2005-306952 | 11/2005 |
| JP | 2006-077234 | 3/2006 |
| JP | 2006-140207 | 6/2006 |
| JP | 2011-032392 | 2/2011 |

* cited by examiner

WHITE THERMOSETTING SILICONE RESIN COMPOSITION FOR A LIGHT-EMITTING SEMICONDUCTOR DEVICE AND A CASE FOR INSTALLING A LIGHT-EMITTING SEMICONDUCTOR ELEMENT

BACKGROUND OF THE INVENTION

1. Field of the Invention

The present invention relates to a case for installing a light-emitting semiconductor element for use in LED etc. formed from a white thermosetting silicone resin composition and a cured material of its composition for a light-emitting semiconductor device, especially the case for installing a light-emitting semiconductor element wherein the resin composition and the cured material have a low light transmittance rate, an excellent moldability and are difficult to cause a burr to occur in molding.

2. Description of the Related Art

A light-emitting semiconductor element such as a LED (Light Emitting Diode) has been widely used as each of various kinds of indicators or light sources for a street display, an automobile lamp, or a residential illumination. Currently, a polyphthalamide resin (PPA) has been widely used as one of the materials of semiconductor devices and electronic devices.

However, there is a problem that light output decrease etc. occurs by yellow discoloration etc., resulting from long-term use of semiconductor element sealing and case using conventional PPA resin materials as colorless or white materials especially. This is because light wavelength is shorter and light energy is higher in order to increment the power and improve the color rendering properties of a light-emitting semiconductor element for increasing in brightness, in recent years.

Additionally, in regards to the details, Patent Document 1 has disclosed a light-emitting semiconductor device consisting of a B-stage epoxy resin composition for sealing light-emitting semiconductor wherein a sealing resin has constituents of an epoxy resin, a curing agent and a hardening accelerator, and a cured material of resin composition which said constituents have been uniformly melted at the molecular level. In this case, a bisphenol A epoxy resin or a bisphenol F epoxy resin is mainly used as an epoxy resin, and it has been disclosed that triglycidyl isocyanurate etc. can also be used. However, the triglycidyl isocyanurate was only used by adding in small amounts to a bisphenol epoxy resin in Examples. And, according to the result of the study by the inventors of the present invention, this B-stage epoxy resin composition for sealing light-emitting semiconductor has a problem that it turns yellow by being left especially for a long time at a high temperature.

Furthermore, Patent Documents 2 to 4 have disclosed use of triazine derivative epoxy resin in an epoxy resin composition for sealing light-emitting element, whereas a problem that it turns yellow by being left for a long time at a high temperature is substantially unresolved in any case.

Moreover, Patent Document 5 has disclosed a resin composition for reflecting light whose light reflectivity in light wavelength of 350 to 800 nm is higher than or equal to 70%. However, since the composition is the epoxy resin composition, it has a potential problem of exhibiting yellow discoloration when it is used for a long time at a high temperature, or when the LED is a high brightness type such as UV LED, white LED and blue LED.

Additionally, Patent Document 6 has disclosed a resin composition for sealing LED containing an organopolysiloxane having a weight-average molecular weight of higher than or equal to $5 \times 10^3$ and a condensation catalyst. However, it is unsuitable for a transfer molding or a compression molding because this organopolysiloxane has to have transparency and be in the form of a liquid at ambient temperature.

Furthermore, Patent Document 7 has disclosed a transfer moldable resin composition for reflector of LED containing an inorganic filler and a condensation catalyst wherein the inorganic filler consists of a silanol group-containing organopolysiloxane, a straight-chain diorganopolysiloxane residue-containing organopolysiloxane, a white pigment and a silica. It can easily cause transmission of light and occurrence of a burr in molding because its refractive index is close to that of silanol group-containing organopolysiloxane and the silica.

CITATION LIST

Patent Documents

Patent Document 1: JP 2,656,336 B
Patent Document 2: JP 2000-196151 A
Patent Document 3: JP 2003-224305 A
Patent Document 4: JP 2005-306952 A
Patent Document 5: JP 2006-140207 A
Patent Document 6: JP 2006-077234 A
Patent Document 7: JP 2011-032392 A

BRIEF SUMMARY OF THE INVENTION

Problems to be Solved by the Invention

In view of above-described problem, it is an object of the present invention to provide a white thermosetting silicone resin composition for a light-emitting semiconductor device having low light transmittance rate, excellent moldability, high flexural strength and failure of the occurrence of burr in molding and a case for installing a light-emitting semiconductor element formed from a cured material of the composition.

As a result of voluntarily repeating examination for achieving the object, the present inventors have revealed that the following thermosetting silicone resin composition can provide a cured material having low light transmittance rate, excellent moldability, high flexural strength and failure of the occurrence of burr in molding, and the cured material is useful in a case for installing a light-emitting semiconductor element.

That is, according to the present invention, there is provided a white thermosetting silicone resin composition for a light-emitting semiconductor device, comprising:

(A) 70 to 95 parts by mass of a resin organopolysiloxane represented by a following average compositional formula (1), wherein a weight-average molecular weight of the resin organopolysiloxane is 500 to 20,000 based on polystyrene conversion, $$(CH_3)_a Si(OR^1)_b (OH)_c O_{(4-a-b-c)/2} \quad (1)$$

wherein $R^1$ represents a same or different organic group of 1 to 4 carbon atoms, and a, b and c are numbers that satisfy $0.8 \leq a \leq 1.5$, $0 \leq b \leq 0.3$, $0.001 \leq c \leq 0.5$ and $0.801 \leq a+b+c < 2$ (B) 5 to 30 parts by mass of an organopolysiloxane having a straight-chain diorganopolysiloxane residue represented by a following general formula (2) and comprising at least one cyclohexyl group or phenyl group in one molecule (wherein a total of the components (A) and (B) is 100 parts by mass.),

[CHEMICAL FORMULA 1]

(2)

wherein each $R^2$ independently represents a hydroxyl group or a monovalent hydrocarbon group selected from among: an alkyl group of 1 to 3 carbon atoms; a cyclohexyl group; a phenyl group; a vinyl group and an allyl group, and m represents an integer of 5 to 50.),
(C) 3 to 300 parts by mass of a white pigment,
(D) 400 to 1,200 parts by mass of an inorganic filler other than (C),
(E) 0.2 to 10.0 parts by mass of a silane coupling agent represented by a following general formula (3), wherein a refractive index difference from the resin organopolysiloxane (A) is higher than or equal to 0.02 and a boiling point at atmospheric pressure is higher than or equal to 200° C., (3)

wherein $R^3$ represents an unsubstituted or substituted monovalent hydrocarbon group of 6 to 20 carbon atoms, $R^4$ represents an alkyl group of 1 to 6 carbon atoms, and d represents 1, 2 or 3, and
(F) 0.01 to 10 parts by mass of a curing catalyst.

Further, according to the present invention, there is provided a case for installing a light-emitting semiconductor element formed from a cured material of the aforementioned white thermosetting silicone resin composition.

Advantageous Effect of the Invention

A white thermosetting silicone resin composition for a light-emitting semiconductor device of the present invention provides a cured material having low light transmittance rate, high flexural strength at room temperature and failure of the occurrence of burr in molding. Furthermore, the cured material is useful in a case for installing a light-emitting semiconductor element.

DETAILED DESCRIPTION OF THE PREFERRED EMBODIMENTS

The present invention will now be described hereinafter in detail.
(A) Resin Organopolysiloxane An organopolysiloxane of component (A) is represented by a following average compositional formula (1), and is for example a resin (i.e. branched or three-dimensional network structure) organopolysiloxane having a weight-average molecular weight of 500 to 20,000 based on polystyrene conversion by gel permeation chromatography (GPC) using a developing solvent such as toluene, and can form a bridged structure in the presence of after-mentioned (D) condensation catalyst.

(1)

(wherein $R^1$ represents a same or different organic group of 1 to 4 carbon atoms, and a, b and c are numbers that satisfy $0.8 \le a \le 1.5$, $0 \le b \le 0.3$, $0.001 \le c \le 0.5$ and $0.801 \le a+b+c < 2$.)

With regard to a composition comprising organopolysiloxane in which a representing a content of methyl group is less than 0.8 in the above-described average compositional formula (1), such composition is not preferable because a cured material of this composition is excessively hard and will often cause problems of a poor crack resistance properties etc. Whereas if a exceeds 1.5, then it is not preferable because a solidification of an obtained resin organopolysiloxane is hardly achievable. a is preferably $0.8 \le a \le 1.2$, more preferably $0.9 \le a \le 1.1$.

In the above-described average compositional formula (1), if b representing a content of alkoxy group exceeds 0.3, then a molecular weight of an obtained resin organopolysiloxane will often become low, and a crack resistance property is more likely to decrease. b is preferably $0.001 \le b \le 0.2$, more preferably $0.01 \le b \le 0.1$.

In the above-described average compositional formula (1), if c representing a content of hydroxyl group bound to Si atom exceeds 0.5, then a hardness of an obtained resin organopolysiloxane will often become high by condensation reaction at thermal curing, whereas a cured material with a poor crack resistance property will often be obtained. Whereas if c is less than 0.001, then a melting point of an obtained resin organopolysiloxane tends to be high and cause problems of workability. c is preferably $0.01 \le c \le 0.3$, more preferably $0.05 \le c \le 0.2$. It is preferable that a complete condensation rate of alkoxy group in raw material meets 86-96% for controlling c value. It is not preferable when the complete condensation rate is less than 86%, because a melting point will become low. And, it is not preferable when the complete condensation rate exceeds 96%, because a melting point will become too high.

For the reasons stated above, in the above-described average compositional formula (1), a+b+c is preferably $0.9 \le a+b+c \le 1.8$, more preferably $1.0 \le a+b+c \le 1.5$.

In the above-described average compositional formula (1), $R^1$ represents an organic group of 1 to 4 carbon atoms, specific examples of the organic group include alkyl group such as methyl group, ethyl group and isopropyl group. It is preferable to use methyl group and isopropyl group, in terms of the availabilities thereof as raw materials.

A weight-average molecular weight of a resin organopolysiloxane of component (A) is 500 to 20,000 based on polystyrene conversion by GPC measurement, preferably 1,000 to 10,000, more preferably 2,000 to 8,000. If the molecular weight is less than 500, then a solidification of an obtained resin organopolysiloxane is hardly achievable. If the molecular weight exceeds 20,000, then fluidity may be low and moldability may degenerate because a viscosity of an obtained composition is too high.

In general, the component (A) represented by the above-described average compositional formula (1) can be expressed by combining the Q unit ($SiO_{4/2}$), the T unit ($CH_3SiO_{3/2}$), the D unit (($CH_3)_2SiO_{2/2}$) and the M unit (($CH_3)_3SiO_{1/2}$). If the component (A) is expressed by this representation method, per total molar number of all siloxane units, a rate of molar number containing T unit is preferably higher than or equal to 70 mol % (70 to 100 mol %), more preferably 75 mol % (75 to 100 mol %), particularly preferably 80 mol % (80 to 100 mol %). If a molar ratio of the T unit is less than 70 mol %, then a comprehensive balance such as hardness, adhesiveness and overview of an obtained hardened material may disrupt. Furthermore, a residual molar ratio may be M unit, D unit and/or Q unit, total molar ratio of these units per all siloxane units is less than or equal to 30 mol % (0 to 30 mol %), particularly exceeds 0 mol % and less than or equal to 30 mol %. Accordingly, T unit is preferably less than 100 mol %.

The component (A) represented by the above-described average compositional formula (1) can be obtained as hydrolytic condensation product of organosilane represented by a following general formula (4).

(wherein X represents halogen atoms such as a chlorine or an alkoxy group of 1 to 4 carbon atoms, and n represents any of 0, 1 and 2.) In the case, it is preferable that X is chlorine atom or a methoxy group for obtaining organopolysiloxane in the form of a solid.

Specific examples of a silane compound represented by the above-described formula (4) include organotrichlorosilane such as methyltrichlorosilane; organotrialkoxy silane such as methyltrimethoxysilane, methyltriethoxysilane; diorganodialkoxysilane such as dimethyldimethoxysilane, dimethyldiethoxysilane; tetrachlorosilane; and tetraalkoxysilane such as tetramethoxysilane, tetraethoxysilane.

Hydrolysis and condensation of the above-described silane compound having a hydrolyzable group can be performed by a standard method, and it is preferable that the method be performed in the presence of, for example, an acid catalyst such as acetic acid, hydrochloric acid and sulfuric acid, or an alkali catalyst such as sodium hydroxide, potassium hydroxide and tetramethylammonium hydroxide. For example, if the silane containing chloro group as the hydrolyzable group is used, hydrolytic condensation product having a desired suitable molecular weight can be obtained as a hydrogen chloride gas and hydrochloric acid generated by water addition is used as catalyst.

An amount of water used in hydrolysis and condensation is 0.9 to 1.6 mol in general, preferably 1.0 to 1.3 mol, per total amount 1 mol of hydrolyzable group (e.g. chloro group) in the silane compound having the above-described hydrolyzable group. If this additive amount is in the range of 0.9 to 1.6 mol, then an after-mentioned composition has an excellent workability and its cured material will often exhibit an excellent toughness.

It is preferable that the above-described silane compound having a hydrolyzable group is used under hydrolytic state in organic solvents such as alcohols, ketones, esters, cellosolves and aromatic compounds. Specific examples of the organic solvents preferably include alcohols such as methanol, ethanol, isopropyl alcohol, isobutyl alcohol, n-butanol and 2-butanol, or aromatic compounds such as toluene and xylene; and isopropyl alcohol, toluene, or combined system of isopropyl alcohol and toluene are more preferable in that a curability of a obtained composition and a toughness of an obtained cured material is excellent.

A reaction temperature of hydrolysis and condensation is preferably 10 to 120° C., more preferably 20 to 80° C. If the reaction temperature satisfies a temperature in this range, a solid hydrolytic condensation product usable in next process is obtained without gelating easily.

(B) Organopolysiloxane

An organopolysiloxane of component (B) has a straight-chain diorganopolysiloxane residue represented by a following general formula (2) and comprises at least one cyclohexyl group or phenyl group in one molecule, preferably two or more cyclohexyl group or phenyl group in one molecule.

[CHEMICAL FORMULA 2]

In the above-described formula (2), each $R^2$ independently is a group selected from among a hydroxyl group, an alkyl group of 1 to 3 carbon atoms, a cyclohexyl group, a phenyl group, a vinyl group and an allyl group. Preferably, $R^2$ is methyl group or phenyl group. m is an integer of 5 to 50, preferably 8 to 40, more preferably 10 to 35. If m is less than 5, an obtained cured material will often exhibit a poor crack resistance property, and a warpage of a device comprising this cured material may occur. Whereas if m exceeds 50, a mechanical strength of an obtained cured material tends to be insufficient.

In addition to D unit ($R^2_2SiO_{2/2}$) represented by the above-described formula (2), a component (B) may include D unit ($R_2SiO$) and M unit ($R_3SiO_{1/2}$) and/or T unit ($RSiO_{3/2}$) conforming to none of the above-described formula (2). In terms of a cured material property, it is preferable that each molar ratio of D unit:M unit:T unit is 90 to 24:75 to 9:50 to 1, especially 70 to 28:70 to 20:10 to 2 (In this regard, the total of these units are 100.). Here, R represents hydroxyl group, methyl group, ethyl group, propyl group, cyclohexyl group, phenyl group, vinyl group or allyl group. In addition to these units, a component (B) may include Q unit ($SiO_{4/2}$). The organopolysiloxane of component (B) includes at least one cyclohexyl group or phenyl group in one molecule among D unit ($R^2_2SiO$) of formula (2), and D unit ($R_2SiO$), M unit ($R_3SiO_{1/2}$) and/or T unit ($RSiO_{3/2}$) conforming to none of the formula (2).

It is preferable that preferably more than or equal to 30 mol % (e.g. 30 to 90 mol %), especially more than or equal to 50 mol % (e.g. 50 to 80 mol %) in organopolysiloxane of component (B) form a straight-chain diorganopolysiloxane structure represented by said general formula (2) in molecule. A weight-average molecular weight of component (B) based on polystyrene conversion by gel permeation chromatography (GPC) is preferably 3,000 to 100,000, more preferably 10,000 to 100,000. If the weight-average molecular weight is in this range, a state of component (B) is in a solid or semi-solid state, which is preferable for workability, curability and the like of an obtained composition.

The component (B) can be synthesized by combining the raw material compounds of each of the above-described units in a manner such that a required molar ratio is achieved in a generated polymer, and then for example performing hydrolyzation and condensation in the presence of acid.

Here, specific examples of the raw material of T unit ($RSiO_{3/2}$) include trichlorosilanes such as methyltrichlorosilane, ethyltrichlorosilane, propyltrichlorosilane, phenyltrichlorosilane, cyclohexyltrichlorosilane; and alkoxysilanes such as trimethoxysilanes corresponding to these trichlorosilanes, respectively.

Specific examples of the raw material of D unit ($R^2{}_2SiO_{2/2}$) forming a straight-chain diorganopolysiloxane residue represented by above-described formula (2) include the following compounds and the like.

[CHEMICAL FORMULA 3]

(wherein m represents an integer of 0 to 48 (mean value), n represents an integer of 3 to 48 (mean value) and m+n represents an integer of 3 to 48 (mean value).)

Additionally, specific examples of the raw material of M unit, D unit and the like can include mono- or di-chlorosilanes such as $Me_2PhSiCl$, $Me_2ViSiCl$, $Ph_2MeSiCl$, $Ph_2ViSiCl$, $Me_2SiCl_2$, $McEtSiCl_2$, $ViMeSiCl_2$, $Ph_2SiCl_2$, $PhMeSiCl_2$; and mono- or di-alkoxysilanes such as mono- or di-methoxysilanes corresponding to these chlorosilanes, respectively. Here, Me represents methyl group, Et represents ethyl group, Ph represents phenyl group and Vi represents vinyl group.

The component (B) can be obtained by a combination of raw material compounds in a required molar ratio and for example the reaction as described below. Phenylmethyldichlorosilane, phenyltrichlorosilane, both-terminal end chloro dimethylpolysiloxane oil of the number of Si 21, and toluene are put and mixed, the mixed silane as the resulting mixture was added dropwise into water, and cohydrolyzed at 30 to 50° C. for 1 hour. The mixture was ripened at 30° C. for 1 hour, washed by adding water, and was then subjected to azeotropic dewatering, filtration and solvent stripping under reduced pressure, through polymerization using ammonia or the like as a catalyst at 25 to 40° C.

Furthermore, the component (B) generated by the above-described hydrolyzation and condensation can have siloxane unit with silanol group. It is preferable that an organopolysiloxane of the component (B) has siloxane unit with silanol group in usually 0.5 to 10 mol %, preferably anywhere 1 to 5 mol % per total siloxane unit. Specific examples of the above-described siloxane unit with silanol group include $R(HO)SiO_{2/2}$ unit, $R(HO)_2SiO_{1/2}$ unit and $R_2(HO)SiO_{1/2}$ unit (wherein R is said group other than hydroxyl group). Since the organopolysiloxane contains silanol group, the organopolysiloxane undergo condensation reaction with resin organopolysiloxane of component (A) comprising hydroxyl group represented by the above-described formula (1).

A blending amount of the component (B) is an amount in the range of ratio of component (A):(B), preferably 95:5 to 70:30, more preferably 90:10 to 80:20 per total 100 parts of components (A) and (B). If the blending amount of the component (B) is too little, then the effect of improving the continuous formability of an obtained composition is low, warp and crack resistance of the obtained composition cannot be achieved easily. Whereas if the blending amount of the component (B) is excessive, then viscosity of the obtained composition tends to increase, thus causing problems in molding.

(C) White Pigment

A white pigment of the component (C) is blended in order to enhance a whiteness degree of a cured material. A white pigment of the component (C) may be the white pigment used in silicone resin composition for preparing a cured material for use in a reflector of a light-emitting semiconductor device and the like. Specific examples of component (C) include rare-earth oxide represented by titanium dioxide, alumina, yttrium oxide; zinc sulfate, zinc oxide, magnesium oxide and the like, and one kind of the white pigment can be solely used, or several types of the same can be used at the same time.

It is preferable that titanium dioxide be used as a white pigment of the component (C) in order to more enhance a whiteness degree. A unit lattice of this titanium dioxide may be any of a rutile type, an anatase type, and a brookite type. Moreover, a product prepared by any method of sulfuric acid method, chlorine method as production methods of titanium dioxide can be used, whereas it is preferable that chlorine method be used in terms of the whiteness degree.

Furthermore, although an average particle diameter or a shape of the component (C) is not restricted, and the average particle diameter is usually 0.05 to 5.0 μm, preferably less than or equal to 1.0 gm, more preferably less than or equal to 0.30 μm. The component (C) can be previously subjected to a surface treatment with a hydrous oxide such as aluminum and silicon; an organic substance such as polyol; or organopolysiloxane etc., in order to more enhance compatibility or dispersibility of a resin component and an inorganic filler. Additionally, the average particle diameter is a value obtained as a mass average value $D_{50}$ (or a median size) in particle size distribution measurement using a laser diffraction method.

A blending amount of the component (C) is usually 3 to 300 parts by mass, preferably 5 to 200 parts by mass, per total 100 parts by mass of components (A) and (B). If the blending amount is less than 3 parts by mass, the sufficient whiteness degree may not be obtained. Moreover, in case of exceeding 300 parts by mass, not only a ratio of other components that are added in order to improve mechanical strength is reduced, but also the moldability of the composition obtained may be considerably lowered in some cases. Furthermore, the component (C) ratio in whole silicone resin composition of the present invention is in the range of preferably 1 to 50 mass %, more preferably 3 to 40 mass %.

(D) Inorganic Filler

Furthermore, an inorganic filler other than the above-described component (C) is blended in a silicone resin composition of the present invention as component (D) in order to enhance a strength of its cured material. An inorganic filler usually blended in silicone resin composition can be used as the inorganic filler of the component (D). Specific examples of component (D) include silica such as fused silica, crystalline silica; alumina, silicon nitride, aluminum nitride, boron nitride, glass fiber, antimony trioxide and the like, whereas the white pigment (white coloring agent) of the above-described component (C) is excluded.

Although an average particle diameter or a shape of the inorganic filler of the component (D) is not restricted, the average particle diameter is usually 3 to 40 μm. Furthermore, the average particle diameter is a value obtained as a mass average value $D_{50}$ (or a median size) in particle size distribution measurement using a laser diffraction method.

Preferably, a spherical silica having average particle diameter of 0.5 to 40 μm is used as component (D). It is preferable to use a combination of the spherical silica of fine particle diameter of 0.1 to 3 μm, middle particle diameter of 3 to 7 μm and rough particle diameter of 10 to 40 μm in order to highly fluidize an obtained composition. It is preferable that the spherical silica having larger average particle diameter are used for higher fluidization. However, if the average particle diameter of the spherical silica as component (D) exceeds 40 μm, then light will easily permeate and a light property preferable as reflector may not be obtained, because refractive index between resin organopolysiloxane of component (A) and spherical silica is close. If crushed silica is included, then strength of an obtained cured material improves, whereas it is not preferable because the fluidity of the composition decreases remarkably.

A blending amount of the component (D) is 400 to 1,200 parts by mass, especially 600 to 1,000 parts by mass, per total 100 parts by mass of components (A) and (B). If the blending amount is less than 400 parts by mass, a cured material having the sufficient strength may not be obtained. Moreover, in case of exceeding 1,200 parts by mass, a filling defects and a flexibility losses of a cured material due to the thickening of the obtained cured material, and then failure such as delamination in the element may occur. Furthermore, the component (D) ratio in whole silicone resin composition of the present invention is in the range of preferably 10 to 90 mass %, more preferably 20 to 80 mass %.

(E) Silane Coupling Agent

A silane coupling agent represented by a following general formula (3) is blended in a silicone resin composition of the present invention.

$$R^3{}_d Si(OR^4)_{4-d} \quad (3)$$

(wherein each $R^3$ independently represents an unsubstituted or substituted monovalent hydrocarbon group of 6 to 20 carbon atoms, each $R^4$ independently represents an alkyl group of 1 to 6 carbon atoms, and d represents 1, 2 or 3) $R^3$ is a group having no functional group; preferably alkyl group or aryl group, especially phenyl group of 6 to 20 carbon atoms, $R^4$ is an alkyl group of 1 to 6 carbon atoms, preferably.

A silane coupling agent of component (E) must have the property that a refractive index difference from the resin organopolysiloxane (A) is higher than or equal to 0.02 and a boiling point under atmospheric pressure is higher than or equal to 200° C. If a refractive index difference from component (A) and component (E) is higher than or equal to 0.02, then light will be reflected easily and permeated not easily, as a result, optical property is improved. If the boiling point of component (E) under atmospheric pressure is higher than or equal to 200° C., the component (E) will be difficult to volatilize in the molding of composition, thus easily existing on an inorganic filler surface and adhering thereon. Additionally, fluidity of composition obtained by blending component (E) is improved.

Furthermore, in accordance with the present invention, refractive index is a value measured at a temperature of 25° C., wavelength of 589.3nm by Abbe's refractometer using method prescribed in the JIS K 0062.

$R^3$ represented by the above-described formula (3) is at least one group selected from group of an unsubstituted or substituted monovalent hydrocarbon group of 6 to 20 carbon atoms. Specific examples of the $R^3$ include alkyl group such as hexyl group, octyl group, decyl group, dodecyl group, tetradecyl group, hexadecyl group and octadecyl group; aryl group such as phenyl group and tolyl group; aralkyl group such as 2-phenylethyl group and 2-methyl-2-phenylethyl group; or halogenated hydrocarbon group (e.g. 2-(perfluoro butyl) ethyl group, 2-(perfluoro octyl)ethyl group, p-chlorophenyl etc.) substituted with halogen atom in part or whole of hydrogen atom bound carbon atom of these groups, and it is preferable to use an unsubstituted alkyl group of 6 to 14 carbon atoms, especially. Additionally, it is preferable that $R^3$ is a group without functional group such as epoxy group, amino group and mercapto group, especially.

Additionally, $R^4$ is alkyl group of 1 to 6 carbon such as methyl group, ethyl group, propyl group, butyl group, pentyl group and hexyl group, preferably one or more alkyl group of 1 to 4 carbon, particularly methyl group, ethyl group, propyl group, butyl group etc., and it is preferable to use methyl group and ethyl group, especially. d represents 1, 2 or 3, and it is preferable when b is 1, especially.

A blending amount of the component (E) is 0.2 to 10.0 parts by mass, especially 1.0 to 5.0 parts by mass, per total 100 parts by mass of components (A) and (B). If the blending amount is less than 0.2 parts by mass, an obtained cured material decreases transmission but does not improve fluidity. If the blending amount exceeds 10 parts by mass, it will easily lead to an occurrence of a burr in molding of a composition and a decrease in the strength of the molded material. Furthermore, a blending amount of coupling agent used in surface treatment and a method for surface treatment is not restricted especially.

(F) Curing Catalyst

A curing catalyst of the component (E) is a condensation catalyst for use in curing thermosetting organopolysiloxane of the above-described component (A) and (B), and is selected in consideration of stability, hardness of coated layer, yellow denaturalization and hardenability etc. of component (A) and (B). It is preferable that zinc organic acids, Lewis acid catalysts, organoaluminum compounds, organic titanium compounds etc. are used as the organometallic catalysts. Specific examples of the organometallic catalysts include zinc benzoate, zinc octoate, zinc p-tert-butylbenzoate, zinc laurate, zinc stearate, aluminum chloride, aluminum perchlorate, aluminum phosphate, aluminum triisopropoxide, aluminum acetylacetonate, ethylacetoacetate aluminum di(normalbutyrate), aluminum-n-butoxydiethylacetoacetic ester, tetrabutyl titanate, tetraisopropyl titanate, tin octoate, cobalt naphthenate, tin naphthenate etc. Above all things, zinc benzoate is preferably used.

A blending amount of the curing catalyst is preferably 0.01 to 10 parts by mass, especially 0.1 to 1.6 parts by mass, per total 100 parts by mass of organopolysiloxane of components (A) and (B). If the blending amount satisfies this range, hardenability of an obtained silicone resin composition improves and stabilizes.

In addition to the above-described components, the following optional components can be blended in a composition of the present invention.

(G) Internal Mold Release Agent

An internal mold release agent can be blended in a silicone resin composition of the invention. A component (G) is blended in order to increase mold release properties in molding, and is added in such a way as to be contained in an amount of 0.2 to 5.0 mass % per whole composition. As internal mold release agent, there is synthetic wax represented by natural wax, acid wax, polyethylene wax, fatty acid wax. Above all things, it is preferable that calcium stearate having a boiling point of 120 to 140° C. is used.

(H) Silane Coupling Agent other than Component (E)

Other than the silane coupling agent of component (E), the coupling agents such as silane coupling agent and titanate coupling agent can be blended in a silicone resin composition of the present invention in order to increase the coupling strength between a silicone resin and an inorganic filler. It is preferable that a coupling agent of component (H) includes a functional group, e.g. at least one functional group selected from epoxy group, amino group and mercapto group. As the silane coupling agent, for example, it is preferable to use epoxy functional alkoxysilane such as γ-glycidoxypropyltrimethoxysilane, γ-glycidoxypropylmethyldiethoxysilane, or β-(3,4-epoxycyclohexyl)ethyltrimethoxysilane; amino functional alkoxysilane such as N-β(aminoethyl)-γ-aminopropyltrimethoxysilane, γ-aminopropyltriethoxysilane, or N-phenyl-γ-aminopropyltrimethoxysilane; or mercapto functional alkoxysilane such as γ-mercaptopropyltrimethoxysilane. Furthermore, a blending amount of coupling agent used in surface treatment and a method for surface treatment is not restricted especially.

A blending amount of component (H) is 0.1 to 8.0 parts by mass, preferably 0.5 to 6.0 parts by mass per 100 parts by mass of the component (A). If the blending amount of component (H) is less than 0.1 parts by mass, effect of attachment to substrate is insufficient. Additionally, if the blending amount of component (H) exceeds 8.0 parts by mass, there is the potential for a void as a result of an extreme decrease in viscosity.

<Other Additive Sgent>

Furthermore, various kinds of additive agent, as necessary, can be blended in a silicone resin composition of the present invention. Provided that they do not impair the effects of the invention, it is able to add and blend, for example, additive agent such as various kinds of a silicone powder, a thermoplastic resin, a thermoplastic elastomer, or an organic synthetic rubber for the purpose of improving properties of the resin; glass fibers and whisker fibers for the purpose of increasing strength of resin; triazine derivative epoxy resin of high heat resistance epoxy resin for the purpose of improving adhesive property; and the like.

As a method for preparing a composition of the present invention, a silicone resin, a white pigment, an inorganic filler, a silane coupling agent, a curing catalyst and others are blended at a predetermined composition ratio, these materials are sufficiently mixed uniformly by using a mixer or the like, then melt mixing processing using a heated roll, a kneader, or an extruder or the like is carried out, subsequently cooling and solidification is performed, and the solidified material is fractured to have an appropriate size, thereby obtaining a molding material of a silicone resin composition. With regard to a cured material of a silicone resin composition of the present invention, a linear expansion coefficient at a temperature exceeding a glass-transition temperature is less than or equal to 30 ppm/K, preferably less than or equal to 25 ppm/K.

The most common molding method of a case for installing a light-emitting semiconductor element according to the present invention is a transfer molding method or a compression molding method. According to the transfer molding method, it is preferable to use a transfer molding machine and carry out molding under a molding pressure of 5 to 20 N/mm² at a molding temperature of 120 to 190° C. for a molding time of 30 to 500 seconds, especially at a molding temperature of 150 to 185° C. for a molding time of 30 to 180 seconds. According to the compression molding method, it is preferable to use a compression molding machine and carry out molding at a molding temperature of 120 to 190° C. for a molding time of 30 to 600 seconds, especially at a molding temperature of 130 to 160° C. for a molding time of 120 to 300 seconds. Further, in both the molding methods, post-cure may be performed at 150 to 200° C for 2 to 20 hours.

EXAMPLES

Specifics of the invention are described below using a series of examples and comparative examples, but the invention is in no way limited by the examples presented below.

The raw materials used in examples and comparative examples were as follows.

In the following description, weight-average molecular weight values were measured with GPC under the following measurement conditions.

<Molecular Weight Measurement Condition>
Developing solvent: tetrahydrofuran
Flow rate: 0.35 mL/min
Detector: RI
Column: TSK-GEL H-type (manufactured by Tosoh Corporation)
Column temperature: 40° C.
Sample injection volume: 5 μL Additionally, in the invention as well as the following examples and comparative examples, refractive index was measured by Abbe's refractometer with a wavelength of 589.3 nanometers at 25° C. in accordance with JIS K 0062.

(A) Synthesis of Resin Organopolysiloxane

Synthesis Example 1

One hundred parts by mass of methyltrichlorosilane and 200 parts by mass of toluene were placed in a 1 L flask, and under cooling in ice, a mixed solution containing 8 parts by mass of water and 60 parts by mass of isopropyl alcohol was added dropwise into the flask over a period of 5 to 20 hours with the internal temperature maintained at −5 to 0° C. Subsequently, the resulting mixture was heated and stirred at the reflux temperature for 20 minutes. The mixture was then cooled to room temperature, 12 parts by mass of water was added dropwise over a period of 30 minutes at a temperature of 30° C. or lower, and the resulting mixture was stirred for 20 minutes. An additional 25 parts by mass of water was then added dropwise, and the resulting mixture was stirred at 40 to 45° C. for 60 minutes. Subsequently, 200 parts by mass of water was added to the mixture, and the organic layer was separated. This organic layer was washed until neutral, and was then subjected to azeotropic dewatering, filtration and solvent stripping under reduced pressure, yielding 36.0 parts by mass of a resin organopolysiloxane (A-1) represented by an average formula (A-1) shown below in the form of a colorless and transparent solid (melting point: 76° C., weight-average molecular weight: 3,060, refractive index: 1.43).

$$(CH_3)_{1.0}Si(OC_3H_7)_{0.07}(OH)_{0.10}O_{1.4} \quad (A\text{-}1)$$

(B) Synthesis of Organopolysiloxane

Synthesis Example 2

Phenylmethyldichlorosilane 100 g (4.4 mol %), phenyltrichlorosilane 2,100 g (83.2 mol %), both-terminal end chloro dimethylpolysiloxane oil of the number of Si 21 2,400 g (12.4 mol %), and toluene 3,000 g were mixed, the resulting silane was added dropwise into water 11,000 g and cohydrolyzed at 30 to 50° C. for 1 hour. The mixture was ripened at 30° C. for 1 hour, washed by adding water, and was then subjected to azeotropic dewatering, filtration and solvent stripping under reduced pressure, yielding product in the form of a colorless and transparent (organopolysiloxane (B-1)). The siloxane (B-1) has melt viscosity 5 Pa·s at 150° C. with ICI cone-plate viscometer, and weight-average molecular weight is 50,000, refractive index is 1.49.

$$[(Me_2SiO)_{21}]_{0.124}(PhMeSiO)_{0.044}(PhSiO_{1.5})_{0.832} \quad (B-1)$$

(C) White Pigment
C-1: Titanium dioxide, rutile-type (CR-95, manufactured by Ishihara Sangyo Kaisha, Ltd.)
C-2: Zinc oxide (JIS #1, manufactured by Mitsui Mining & Smelting Co. Ltd.)
(D) Inorganic Filler
D-1: Fused spherical silica A (RS-8225/53C, manufactured by Tatsumori Ltd., average particle size of 10 μm)
D-2: Fused spherical silica B (ES-105, manufactured by Tokai Minerals Co., Ltd., average particle size of 35 μm)
D-3: Fused spherical silica C (N-MSR-04, manufactured by Tatsumori Ltd., average particle size of 4 μm)
D-4: Fused spherical silica D (S0-25R, manufactured by Admatechs Company Limited, average particle size of 0.5 μm)
D-5: Crushed silica (FMT-10C, manufactured by Fukushima Yogyo Ltd., average particle size of 10 μm)
(E) Silane Coupling Agent
E-1: Hexyltrimethoxysilane (KBM-3063, manufactured by Shin-Etsu Chemical Co., Ltd., refractive index: 1.40, boiling point: 202° C.)
E-2: Phenyltrimethoxysilane (KBM-103, manufactured by Shin-Etsu Chemical Co., Ltd., refractive index: 1.47, boiling point: 218° C.)
E-3: Methyltrimethoxysilane (KBM-13, manufactured by Shin-Etsu Chemical Co., Ltd., refractive index: 1.37, boiling point: 102° C.)
E-4: Decyltrimethoxysilane (KBM-3103C, manufactured by Shin-Etsu Chemical Co., Ltd., refractive index: 1.42, boiling point: 214° C.)
(F) Curing Catalyst
F-1: Zinc benzoate (manufactured by Wako Pure Chemical Industries, Ltd.)
(G) Mold Release Agent
G-1: Ester mold release agent (Kao Wax 220, manufactured by Kao Corporation)
(H) Silane Coupling Agent other than (E)
H-1: (3-Mercaptopropyl)trimethoxysilane (KBM-803, manufactured by Shin-Etsu Chemical Co., Ltd., boiling point: 198° C., refractive index: 1.44)

Examples 1 to 5, Comparative Examples 1 to 5

Ingredients (parts by mass) shown in Table 1 were melt-mixed by two rolls, cooled and crushed, yielding a white silicone resin composition. With regard to these compositions and cured products, the properties described below were measured. The results are shown in Table 1.
<Spiral Flow Value>
Using a molding die prescribed in the EMMI standards, a test piece was prepared from each composition under conditions including a molding temperature of 175° C., a molding pressure of 6.9 N/mm², and a molding time of 120 seconds, and a spiral flow value was measured.
<Minimum Melt Viscosity>
Using a Koka-type flow tester and a nozzle with a diameter of 1 mm, the viscosity of each composition at a temperature of 175° C. was measured under a pressure of 25 kgf.
<Flexural Strength and Flexural Modulus at Room Temperature>
A test piece prepared by using a molding die prescribed in the JIS-K6911 standard to perform molding under conditions including a molding temperature of 175° C., a molding pressure of 6.9 N/mm² and a molding time of 120 seconds, and then performing post-curing at 180° C. for 4 hours, was measured for flexural strength and flexural modulus at room temperature (25° C.).
<Light Reflectance Rate>
A circular plate-shaped cured product having a length along one side of 50 mm and a thickness of 0.20 mm was prepared under conditions including a molding temperature of 175° C., a molding pressure of 6.9 N/mm² and a molding time of 120 seconds, and the initial light reflectance of the cured product for light of 450 nm was measured using an X-rite 8200 manufactured by S.D.G
<Light Transmittance Rate >
A circular plate -shaped cured product having a length along one side of 50 mm and a thickness of 0.20 mm was prepared under conditions including a molding temperature of 175° C., a molding pressure of 6.9 N/mm² and a molding time of 120 seconds, and the initial light transmittance of the cured product for light of 450 nm was measured using an X-rite 8200 manufactured by S.D.G K.K.
<Burr Length >
When a burr having a thickness of 30 μm was prepared under conditions including a molding temperature of 175° C., a molding pressure of 6.9 N/mm² and a molding time of 120 seconds, a maximum length of such burr was measured using a vernier caliper.

TABLE 1

| | Composition ingredients (parts by mass) | | | Example | | | | | Comparative example | | | | |
|---|---|---|---|---|---|---|---|---|---|---|---|---|---|
| | | | | 1 | 2 | 3 | 4 | 5 | 1 | 2 | 3 | 4 | 5 |
| (A) | Resin organopolysiloxane | | A-1 | 90.0 | 90.0 | 90.0 | 90.0 | 90.0 | 90.0 | 90.0 | 90.0 | 90.0 | 90.0 |
| (B) | Organopolysiloxane | | B-1 | 10.0 | 10.0 | 10.0 | 10.0 | 10.0 | 10.0 | 10.0 | 10.0 | 10.0 | 10.0 |
| (C) | White pigment | CR-95 | C-1 | 123.0 | 123.0 | 123.0 | 123.0 | 123.0 | 123.0 | 123.0 | 123.0 | 123.0 | 123.0 |
| (D) | Inorganic filler | RSW-8225/53C | D-1 | 650.0 | 650.0 | 650.0 | — | — | 650.0 | 650.0 | 650.0 | — | — |
| | | ES-105 | D-2 | — | — | — | 325.0 | 325.0 | — | — | — | 450.0 | 360.0 |
| | | N-MSR-04 | D-3 | — | — | — | 195.0 | 195.0 | — | — | — | 150.0 | 120.0 |
| | | SO-25R | D-4 | — | — | — | 130.0 | 130.0 | — | — | — | 50.0 | 40.0 |
| | | FMT-10C | D-5 | — | — | — | — | — | — | — | — | — | 130.0 |

TABLE 1-continued

|  | Composition ingredients (parts by mass) |  |  | Example |  |  |  |  | Comparative example |  |  |  |  |
|---|---|---|---|---|---|---|---|---|---|---|---|---|---|
|  |  |  |  | 1 | 2 | 3 | 4 | 5 | 1 | 2 | 3 | 4 | 5 |
| (E) | Silane coupling agent | KBM-3063 | E-1 | 2.0 | — | 1.0 | 2.0 | — | — | — | — | — | — |
|  |  | KBM-103 | E-2 | — | 2.0 | 1.0 | — | 2.0 | — | — | — | — | — |
|  |  | KBM-13 | E-3 | — | — | — | — | — | — | 1.0 | — | — | — |
|  |  | KBM-3103 | E-4 | — | — | — | — | — | — | — | 1.0 | — | — |
| (F) | Curing catalyst | Zinc benzoate | F-1 | 1.1 | 1.1 | 1.1 | 1.1 | 1.1 | 1.1 | 1.1 | 1.1 | 1.1 | 1.1 |
| (G) | Internal mold release agent | Kao Wax 220 | G-1 | 1.5 | 1.5 | 1.5 | 1.5 | 1.5 | 1.5 | 1.5 | 1.5 | 1.5 | 1.5 |
| (H) | Silane coupling agent other than (E) | KBM-803 | H-1 | 0.5 | 0.5 | 0.5 | 0.5 | 0.5 | 0.5 | 0.5 | 0.5 | 0.5 | 0.5 |
| Evaluation result | Average particle size of component (D) | um |  | 10 | 10 | 10 | 19 | 19 | 10 | 10 | 10 | 25 | 22 |
|  | Spiral flow value | inch |  | 20 | 18 | 18 | 25 | 21 | 12 | 11 | 16 | 15 | 5 |
|  | Minimum melt viscosity | Pa·s |  | 68 | 90 | 79 | 48 | 72 | 121 | 118 | 72 | 75 | Unshapable |
|  | Flexural strength at room temperature | MPa |  | 51 | 53 | 50 | 50 | 54 | 49 | 48 | 45 | 50 |  |
|  | Flexural modulus at room temperature | MPa |  | 10800 | 11000 | 11000 | 11400 | 12000 | 11500 | 11400 | 10200 | 11200 |  |
|  | Light reflectance rate (450 nm) | % |  | 96.2 | 96.0 | 96.8 | 95.8 | 95.6 | 94.8 | 94.8 | 94.8 | 93.8 |  |
|  | Light transmittance rate (450 nm) | % |  | 3.8 | 4.2 | 4.0 | 4.5 | 4.7 | 7.1 | 6.8 | 7.2 | 9.8 |  |
|  | Barr length | mm |  | 1.2 | 1.0 | 1.2 | 1.8 | 1.7 | 1.2 | 1.2 | 3.2 | 2.7 |  |

As described in Table 1, it was proved that by using certain silane coupling agent (E) to the resin organopolysiloxane of component (A), the moldability of the composition and the light property of the cured product could be improved while retaining the other properties such as the mechanical strength of the cured product.

Example 6

Molding of Reflector and Physical Properties Thereof

Figure 1A:
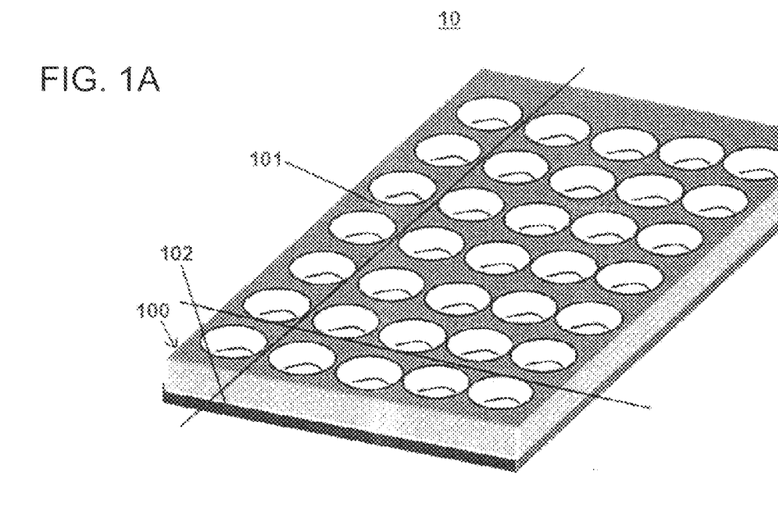
FIG. 1a shows a matrix type concave reflector substrate according to a light-emitting semiconductor element of the present invention.
Figure 1B:
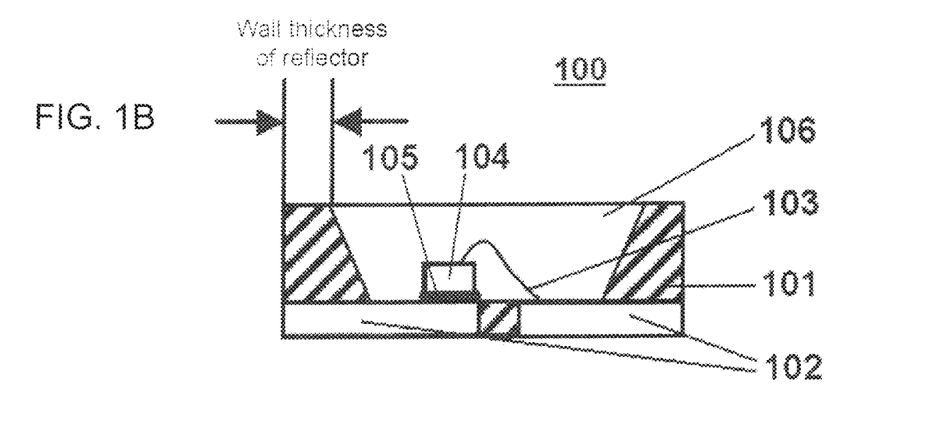
FIG. 1b is a cross-sectional view of the devices installed LED elements into a divided reflector substrate according to a light-emitting semiconductor element of the present invention.
Figure 1C:
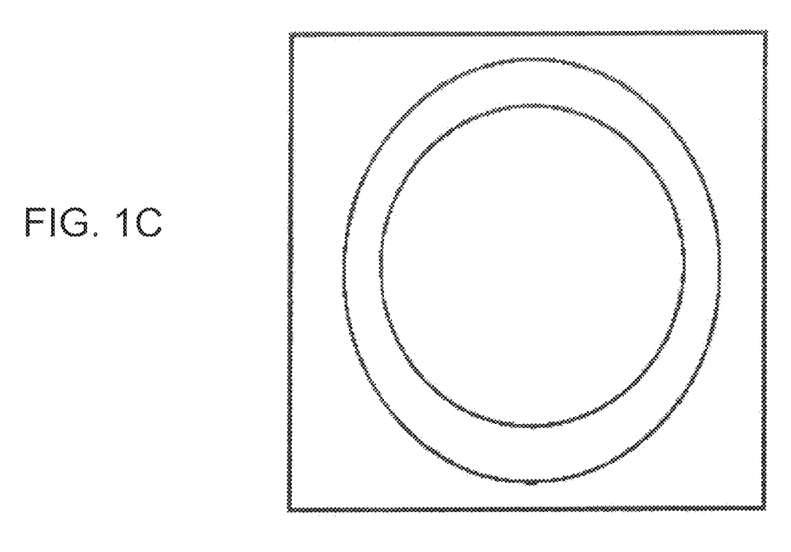
FIG. 1c is a two-dimensional diagram of the devices according to a light-emitting semiconductor element of the present invention.

Using the resin compositions produced in Example 1 and Comparative example 4, and a totally silver-plated copper lead frame 102, a matrix type concave reflector substrate 10 illustrated in FIG. 1 was prepared by transfer molding the composition under the following molding conditions.

The molding conditions were as follows.
Molding temperature: 175° C.
Molding pressure: 100 N/mm²
Molding time: 120 seconds
A post cure was also performed at 180° C. for 4 hours.
A blue LED element 104 was placed on a portion of the copper lead frame 102 exposed within each concave bottom of the obtained matrix type concave reflector substrate 10, and an electrode of such blue LED element 104 was then bonded to the copper lead frame 102, using a silicone die bonding agent 105 (product name: LPS632D, manufactured by Shin-Etsu Chemical Co., Ltd.). And also, the other electrode of the blue LED element 104 was electrically connected to another lead portion of the lead frame 102 using a gold wire 103. Subsequently, a clear silicone sealing agent (LPS380, manufactured by Shin-Etsu Chemical Co., Ltd.) 106 was injected into the concave opening in which the LED element had been positioned, and curing was performed at 120° C. for 1 hour and then at 150° C. for 1 hour to seal the LED element 104.

The matrix type reflector substrate 10 was divided into individual devices by dicing. The divided concave reflector substrates 100 had a dimension of upper wall thickness 1 mm, height 38 mm and width 16 mm. With respect to five LED mounted devices assembled from these divided reflector substrates 100, the brightness was measured using a CS-2000A device manufactured by KONICA MINOLTA, INC. When the brightness of the LED-mounted device using the reflector substrates 100 molded from the composition of Example 1 was deemed to be 100, the brightness of the LED-mounted device prepared in Comparative example 4 was a lower value of 90.

DESCRIPTION OF THE REFERENCE SIGNS

10: Concave reflector substrate
100: Divided individual concave reflector substrate
101: Resin composition
102: Lead frame
103: Gold wire
104: LED element
105: Die bonding agent
106: Transparent sealing resin

What is claimed is:

1. A white thermosetting silicone resin composition for a light-emitting semiconductor device, comprising:
(A) 70 to 95 parts by mass of a resin organopolysiloxane represented by a following average compositional formula (1), wherein a weight-average molecular weight of the resin organopolysiloxane is 500 to 20,000 based on polystyrene conversion, $$(CH_3)_a Si(OR^1)_b (OH)_c O_{(4-a-b-c)/2} \quad (1)$$

wherein $R^1$ represents a same or different organic group of 1 to 4 carbon atoms, and a, b and c are numbers that satisfy $0.8 \leq a \leq 1.5$, $0 \leq b \leq 0.3$, $0.001 \leq c \leq 0.5$ and $0.801 \leq a+b+c<2$, (B) 5 to 30 parts by mass of an organopolysiloxane having a straight-chain diorganopolysiloxane residue represented by a following general formula (2) and comprising at least one cyclohexyl group or phenyl group in one molecule, wherein a total of the components (A) and (B) is 100 parts by mass, (2)

wherein each $R^2$ independently represents a hydroxyl group or a monovalent hydrocarbon group selected from among: an alkyl group of 1 to 3 carbon atoms; a cyclohexyl group; a phenyl group; a vinyl group and an allyl group, and m represents an integer of 5 to 50, (C) 3 to 300 parts by mass of a white pigment, (D) 400 to 1,200 parts by mass of an inorganic filler other than (C), (E) 0.2 to 10.0 parts by mass of a silane coupling agent represented by a following general formula (3), wherein a refractive index difference from the resin organopolysiloxane (A) is higher than or equal to 0.02 and a boiling point at atmospheric pressure is higher than or equal to 200° C., $$R^3{}_d Si(OR^4)_{4-d} \quad (3)$$

wherein $R^3$ represents an unsubstituted monovalent hydrocarbon group of 6 to 20 carbon atoms, $R^4$ represents an alkyl group of 1 to 6 carbon atoms, and d represents 1, 2 or 3, and (F) 0.01 to 10 parts by mass of a curing catalyst.

2. The white thermosetting silicone resin composition according to claim 1 for use in manufacturing a case for installing a light-emitting semiconductor element.

3. The white thermosetting silicone resin composition according to claim 2, wherein the inorganic filler of the component (D) is a spherical silica having an average particle size of 5.0 to 20.0 µm.

4. The white thermosetting silicone resin composition according to claim 3, wherein the curing catalyst of the component (F) is an organic metal condensation catalyst.

5. The white thermosetting silicone resin composition according to claim 4, further comprising at least one selected from among an internal mold release agent as component (G); and a coupling agent other than the component (E) as a component (H).

6. The white thermosetting silicone resin composition according to claim 3, further comprising at least one selected from among an internal mold release agent as a component (G); and a coupling agent other than the component (E) as a component (H).

7. The white thermosetting silicone resin composition according to claim 2, wherein the curing catalyst of the component (F) is an organic metal condensation catalyst.

8. The white thermosetting silicone resin composition according to claim 7, further comprising at least one selected from among an internal mold release agent as a component (G); and a coupling agent other than the component (E) as a component (H).

9. The white thermosetting silicone resin composition according to claim 2, further comprising at least one selected from among an internal mold release agent as a component (G); and a coupling agent other than the component (E) as a component (H).

10. The white thermosetting silicone resin composition according to claim 1, wherein the inorganic filler of the component (D) is a spherical silica having an average particle size of 5.0 to 20.0 µm.

11. The white thermosetting silicone resin composition according to claim 10, wherein the curing catalyst of the component (F) is an organic metal condensation catalyst.

12. The white thermosetting silicone resin composition according to claim 11, further comprising at least one selected from among an internal mold release agent as a component (G); and a coupling agent other than the component (E) as a component (H).

13. The white thermosetting silicone resin composition according to claim 10, further comprising at least one selected from among an internal mold release agent as a component (G); and a coupling agent other than the component (E) as a component (H).

14. The white thermosetting silicone resin composition according to claim 1, wherein the curing catalyst of the component (F) is an organic metal condensation catalyst.

15. The white thermosetting silicone resin composition according to claim 14, further comprising at least one selected from among an internal mold release agent as a component (G); and a coupling agent other than the component (E) as a component (H).

16. The white thermosetting silicone resin composition according to claim 1, further comprising at least one selected from among an internal mold release agent as a component (G); and a coupling agent other than the component (E) as a component (H).

17. A case for installing a light-emitting semiconductor element, formed from the white thermosetting silicone resin composition according to claim 1.

* * * * *